(12) United States Patent
Handa et al.

(10) Patent No.: US 7,718,005 B2
(45) Date of Patent: May 18, 2010

(54) FILM FORMING EQUIPMENT AND FILM FORMING METHOD

(75) Inventors: Tatsuya Handa, Nirasaki (JP); Yasushi Aiba, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 498 days.

(21) Appl. No.: 11/661,126

(22) PCT Filed: Aug. 25, 2005

(86) PCT No.: PCT/JP2005/015436

§ 371 (c)(1),
(2), (4) Date: Feb. 26, 2007

(87) PCT Pub. No.: WO2006/022328

PCT Pub. Date: Mar. 2, 2006

(65) Prior Publication Data

US 2007/0254101 A1    Nov. 1, 2007

(30) Foreign Application Priority Data

Aug. 25, 2004   (JP) .............................. 2004-245835

(51) Int. Cl.
 *C23C 16/00*   (2006.01)
 *C23C 16/52*   (2006.01)
(52) U.S. Cl. ..................... 118/715; 118/724; 118/695; 427/8; 427/248.1
(58) Field of Classification Search ................. 118/715, 118/724; 427/8, 248.1
See application file for complete search history.

(56) References Cited

U.S. PATENT DOCUMENTS

| 6,137,562 A | * | 10/2000 | Masuyuki et al. ............. 355/73 |
| 6,162,336 A | * | 12/2000 | Lee ....................... 204/298.15 |
| 2003/0164934 A1 | * | 9/2003 | Nishi et al. .................... 355/72 |

FOREIGN PATENT DOCUMENTS

| JP | 4 18446 | 2/1992 |
| JP | 2003 193233 | 7/2003 |
| JP | 2005 126814 | 5/2005 |

\* cited by examiner

*Primary Examiner*—Shamim Ahmed
(74) *Attorney, Agent, or Firm*—Oblon, Spivak, McClelland, Maier & Neustadt, L.L.P.

(57) ABSTRACT

Film forming equipment (20) is provided with a treatment container (22), a gas supplying system for supplying the container with a treatment gas including a film forming gas, and an exhaust system for exhausting the atmosphere in the container. In the treatment container, a placing table (46) having a placing plane for placing a flat board shaped body to be treated (W) is arranged. The body to be treated on the placing table is heated by a heater (80). A clamping apparatus (56) is provided to abut/separate to and from a surface peripheral part of the body to be treated, so as to press/release the body to be treated on and from the placing table. On the placing plane of the placing table, a suction structure (92) having a recessed part (94) is formed for temporarily sucking the body to be treated by pressure difference, by forming a substantially hermetic space between the placing plane and the rear plane of the body to be treated.

19 Claims, 9 Drawing Sheets

FILM FORMING EQUIPMENT AND FILM FORMING METHOD

FIELD OF THE INVENTION

The present invention relates to a film forming apparatus and method for forming a thin film such as a tungsten film or the like on a target object such as a semiconductor wafer or the like and also relates to a computer program for controlling the film forming apparatus.

BACKGROUND OF THE INVENTION

In general, in the manufacturing process of a semiconductor integrated circuit, forming a thin film of a metal or a metal compound such as W (tungsten), WSi (tungsten silicide), Ti (titanium), TiN (titanium nitride), TiSi (titanium silicide), Cu (copper), $Ta_2O_5$ (tantalum oxide) or the like has been performed to form a wiring pattern on a semiconductor wafer surface or to fill up a recess formed between wirings or a contact recess. Among these thin films, a tungsten film is widely employed because it has a small resistivity, a low film deposition temperature, and so on. By reducing $WF_6$ (tungsten hexafluoride) employed as a source gas by using, e.g., hydrogen, silane, dichlorosilane or the like, tungsten is deposited to thereby form the tungsten film.

In case of forming the tungsten film, the tungsten film is deposited on a barrier layer formed on the wafer surface in advance in order to enhance its adhesivity and to suppress its reaction with a silicon underlayer. A Ti film, a TiN film or a laminated film thereof is thin and uniformly formed on the wafer surface as the barrier layer. In order to form the tungsten film, $WF_6$ (tungsten hexafluoride) gas and $H_2$ gas are generally used as film forming gases due to their high film forming rate. However, depositing the tungsten film directly on the barrier layer by employing the deposition gases gives rise to problems as follows. First, there may be a long incubation period in which there occurs no film deposition even while the film forming gases are supplied, thereby deteriorating a throughput of processing. Further, fluorine in the $WF_6$ gas may be diffused into the barrier layer to react with the Ti (titanium) such that the reacted portion of the barrier layer swells up in a protruded shape, thereby resulting in defects in an integrated circuit device.

To solve the problems, e.g., Japanese Patent Laid-Open Application No. 2003-193233 discloses a film forming method as follows. Namely, before depositing a film by using $WF_6$ gas and $H_2$ gas, a very thin layer of a seed film made of crystal nuclei of tungsten is formed by using the $WF_6$ gas and a gas having a higher reducibility than the $H_2$ gas, e.g., a silane-based gas such as monosilane ($SiH_4$) or the like. Thereafter, the $WF_6$ gas and the $H_2$ gas are supplied to deposit a film on the top of the seed film by CVD (Chemical Vapor Deposition), thereby forming a main tungsten film.

The above film forming method will be briefly described with reference to FIGS. 10A and 10B. A semiconductor wafer W, which is a target object, is mounted on a mounting table 2. The mounting table 2 is installed in an evacuable processing chamber (not shown). By applying a clamp ring 4 to make a contact with a peripheral portion of the wafer W to press the wafer W against the mounting table 2, the wafer W is kept to be prevented from being slid to side for example. In such a state, the $WF_6$ gas, the $SiH_4$ gas and the $H_2$ gas serving as the film forming gases are supplied to deposit a seed film 6 (first thin film) made of crystal nuclei of tungsten on the wafer W as depicted in FIG. 10A. Then, as shown in FIG. 10B, the $WF_6$ and the $H_2$ gas are simultaneously supplied as the film forming gases to thereby form a main film 8 (second thin film) made of metal tungsten starting from the top of the seed film 6 at a higher film forming rate as shown in FIG. 10B. Further, in the serial film forming processes, an inert gas, e.g., Ar is supplied as a backside gas to a backside of the mounting table 2 in order to prevent the film forming gases from turning around into the backside of the mounting table 2.

As described above, the main film 8 is formed by depositing the thin film starting from the top of the seed film 6, thereby enhancing the overall film forming rate. Furthermore, since the seed film 6 functions as a barrier, fluorine in the $WF_6$ gas can be prevented from being diffused into an underlayer of a TiN film while the main film 8 is deposited.

However, even though the backside gas is supplied to the backside of a mounting table 2 when the main film 8 shown in FIG. 10B is deposited, the film forming gases infiltrate deeply into innermost region of the gap 10 between a lower surface of a clamp ring 4 and a top surface of a peripheral portion of the wafer W. This is because, e.g., a process pressure at this time is set to be higher than that of forming the seed film 6 shown in FIG. 10A. Accordingly, as shown in FIG. 10B, the main film 8 is formed such that an outer edge 8A of the main film 8 entirely covers an outer edge 6A of the seed film 6 and is further enlarged to an outer side of the outer edge 6A. As a consequence, a peripheral portion 12 of the wafer at the outer side of the outer edge 6A of the seed film 6 is exposed to and attacked by an excessive amount of fluorine in the $WF_6$ gas. Further, since the main film 8 is directly formed on the peripheral portion 12 of the wafer not through the seed film 6, fluorine is diffused into the barrier underlayer to react with Ti therein, resulting in the reacted portion thereof being swollen up in a protruded shape.

SUMMARY OF THE INVENTION

It is, therefore, an object of the present invention to prevent the second thin film from making a direct contact with the surface of the target object (where the first thin film is not formed) by making the first thin film be formed wider than a forming area of a second thin film, wherein when forming the first thin film such as a seed film or the like on the target object, the target object is held on a mounting table without making a clamp device contact with a peripheral region of the object, thereby allowing the first thin film to be formed wider than the forming area of second thin film.

In accordance with a first aspect of the present invention, there is provided a film forming apparatus including: a processing chamber; a gas exhaust system for exhausting an inner atmosphere of the processing chamber; a mounting table having a mounting surface for mounting thereon a flat target object, the mounting table being provided in the processing chamber; a gas supply system for supplying a processing gas containing a film forming gas into the processing chamber; a heater for heating the target object on the mounting table; a clamp device for pressing and releasing the target object with respect to the mounting table by contacting with and separating from a peripheral portion of a surface of the target object; and an adsorption structure formed on the mounting surface of the mounting table for adsorbing the target object temporarily by means of a pressure difference caused by substantially sealed spaces defined between a backside of the target object and the mounting surface of the mounting table.

In accordance with the film forming apparatus, in case of forming a first and a second thin film sequentially on the surface of the target object, after the clamp device is separated from the target object and the first thin film is formed while the target object is adsorbed on the mounting table with the use of an adsorption structure, the second thin film can be formed while the peripheral portion of the target object being pressed toward the mounting table by the clamp device. As a consequence, it is possible to prevent the second thin film from making a direct contact with the surface of the target object (where the first thin film is not formed) by making the first thin film be formed at outer side extended further than a forming area of the second thin film.

More specifically, the film forming apparatus may further include a controller for controlling the gas exhaust system, the gas supply system, the heater and the clamp device to perform the steps of:

(a) decreasing the pressure in the processing chamber to an initial pressure lower than an atmospheric pressure;

(b) forming a first thin film on the surface of the target object, which includes the sub-steps of (b1) adsorbing the target object on the mounting table with the help of the adsorption structure by adjusting the inner pressure of the processing chamber to a level higher than the initial pressure but lower than the atmospheric pressure while the clamp device is separated from the target object; and (b2) forming the first thin film by supplying a first processing gas into the processing chamber while heating the target object adsorbed on the mounting table; and (c) forming a second thin film on the first thin film, which includes the sub-steps of (c1) pressing the target object against the mounting table by making the clamp device contact with the target object; and (c2) forming the second thin film by supplying a second processing gas into the processing chamber while heating the target object pressed against the mounting table.

Further, in accordance with a second aspect of the present invention, there is provided a film forming method for forming a first and a second thin film sequentially on a surface of a target object by using a film forming apparatus including: a processing chamber; a mounting table having a mounting surface for mounting thereon the flat target object, the mounting table being provided in the processing chamber; a clamp device for pressing and releasing the target object with respect to the mounting table by contacting with and separating from a peripheral portion of a surface of the target object; and an adsorption structure formed on the mounting surface of the mounting table for adsorbing the target object temporarily by means of a pressure difference caused by substantially sealed spaces defined between a backside of the target object and the mounting surface of the mounting table; the film forming method including the steps of: (a) decreasing the inner pressure in the processing chamber to an initial pressure lower than an atmospheric pressure; (b) forming the first thin film on a surface of the target object, which includes the sub-steps of (b1) adsorbing the target object on the mounting table with the help of the adsorption structure by adjusting the pressure in the processing chamber to a level higher than the initial pressure but lower than the atmospheric pressure while a clamp device is separated from the target object; and (b2) forming the first thin film by supplying a first processing gas into the processing chamber while heating the target object adsorbed on the mounting table; and (c) forming the second thin film on the first thin film, which includes the sub-steps of (c1) pressing the target object against the mounting table by making the clamp device contact with the target object; and (c2) forming the second thin film by supplying a second processing gas into the processing chamber while heating the target object pressed against the mounting table.

Furthermore, in accordance with a third aspect of the present invention, there is provided a storage medium storing a program for controlling a gas exhaust system, a gas supply system, a heater and a clamp device to perform a film forming process for forming a first and a second thin film sequentially on a surface of a target object by using a film forming apparatus including: a processing chamber; the gas exhaust system for exhausting an inner atmosphere of the processing chamber; a mounting table having a mounting surface for mounting thereon the flat target object, the mounting table being provided in the processing chamber; the gas supply system for supplying a processing gas containing a film forming gas into the processing chamber, the heater for heating the target object on the mounting table; the clamp device for pressing and releasing the target object with respect to the mounting table by contacting to and separating from a peripheral portion of a surface of the target object; and the adsorption structure formed on the mounting surface of the mounting table for adsorbing the target object temporarily by means of a pressure difference caused by substantially sealed spaces defined between a backside of the target object and the mounting surface of the mounting table; and wherein the first film forming process comprises the steps of: (a) decreasing the pressure in the processing chamber to an initial pressure lower than an atmospheric pressure; (b) forming the first thin film on the surface of the target object, which includes the sub-steps of (b1) adsorbing the target object on the mounting table with the help of an adsorption structure while separating the clamp device from the target object by adjusting the pressure in the processing chamber to a level higher than the initial pressure but lower than the atmospheric pressure; and (b2) forming the first thin film by supplying a first processing gas into the processing chamber while heating the target object adsorbed on the mounting table; and (c) forming the second thin film on the first thin film, which includes the sub-steps of (c1) pressing the target object against the mounting table by making the clamp device contact with the target object; and (c2) forming the second thin film by supplying a second processing gas into the processing chamber while heating the target object pressed against the mounting table.

As described above, the first thin film is formed on the target object while the clamp device is separated from the peripheral region of the target object and the second thin film is formed on the target object while the peripheral portion of the target object is pressed against the mounting table by the clamp device. Accordingly, it is possible to prevent the second thin film from making a direct contact with the surface of the target object by allowing the first thin film to be formed over an area greater than a forming area of the second thin film.

DETAILED DESCRIPTION OF THE PREFERRED EMBODIMENTS

Hereinafter, embodiments of the film forming apparatus and film forming method in accordance with the present invention will be described with reference to accompanying drawings.

Figure 1:
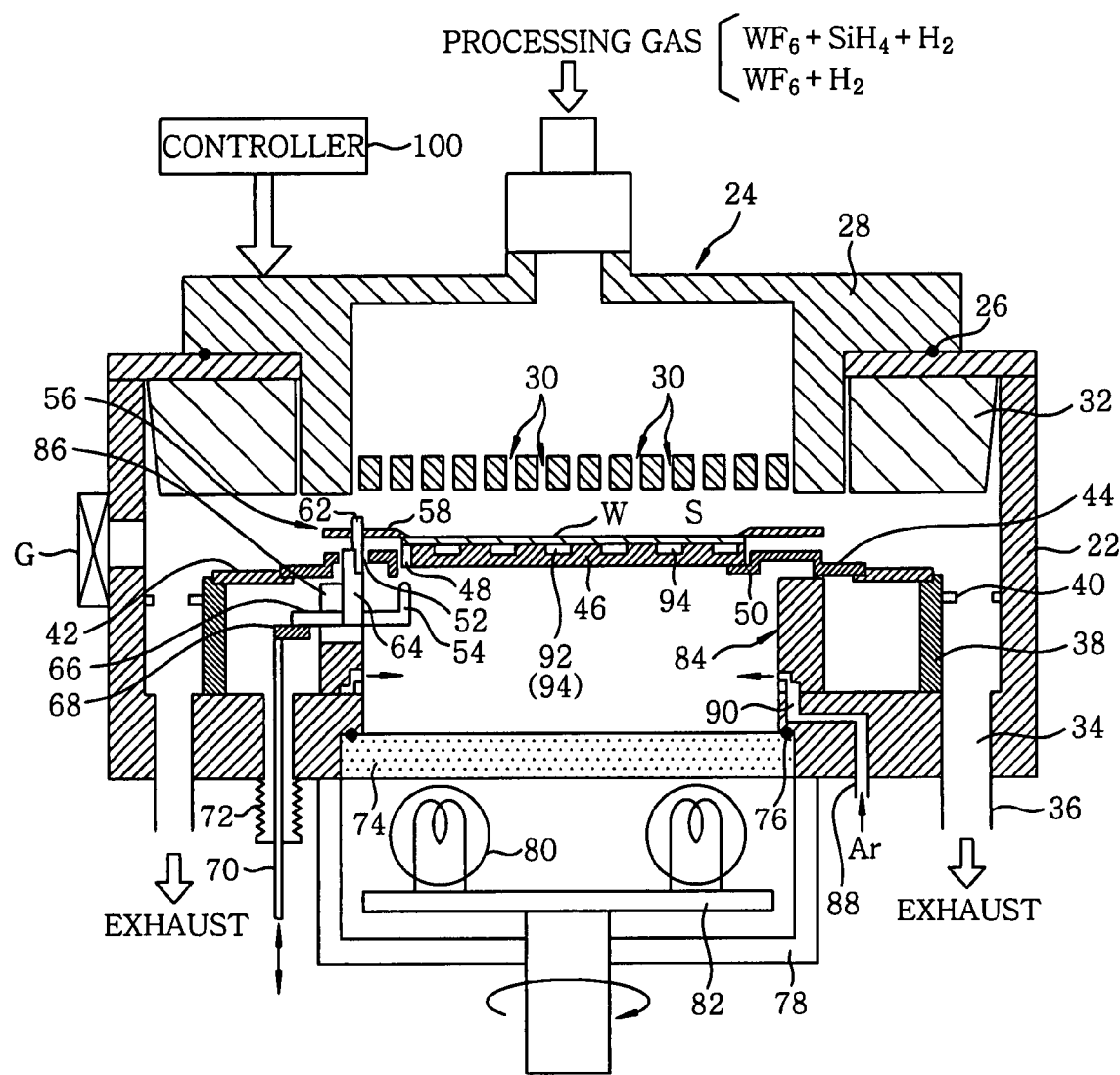
FIG. 1 is a cross sectional view showing a first embodiment of a film forming apparatus in accordance with the present invention.

A film forming apparatus 20 of an embodiment shown in FIG. 1 is a single wafer type film forming apparatus capable of raising a temperature rapidly by using heating lamps 80 as heaters. The film forming apparatus 20 includes a cylindrical processing chamber 22 formed of, e.g., aluminum. A shower head 24 as a part of a gas supply system for supplying a processing gas containing a film forming gas into the processing chamber is attached to a ceiling portion of the processing chamber 22 via a sealing member 26 such as an O-ring or the like. The shower head 24 has a hollow columnar head body 28 formed of, e.g., aluminum. A plurality of gas injection openings 30, through which gases supplied in the head body 28 are injected into a processing space S, are uniformly arranged in a gas injection surface, i.e., the bottom surface of the head body 28.

The shower head 24 is not limited to the aforementioned configuration and may have various configurations. For example, in case that the gases are not allowed to be mixed in the head body 28, the inside of the head body 28 is partitioned into a plurality of regions, so that the gases are independently diffused; and the gases will be mixed for the first time when they are supplied into the processing space S through the gas injection openings 30. At the ceiling portion of the processing chamber 22, a ring-shaped gas flow stabilization member 32 made of, e.g., quartz is provided at the outside of the shower head 24 in order to stabilize gas flows.

A gate valve G that is opened and closed when the wafer is loaded or unloaded is disposed at the side wall of the processing chamber 22. The processing chamber 22 is connected via the gate valve G to, e.g., a load-lock chamber or a transfer chamber (not shown) that can be evacuated. Further, a gas exhaust port 34 is formed at a peripheral portion of the bottom of the processing chamber 22. A gas exhaust system for exhausting an inner atmosphere of the processing chamber 22 while controlling the pressure therein is configured by connecting a gas exhaust path 36 provided with a vacuum pump (not shown) or the like to the gas exhaust port 34.

A cylindrical supporting column 38 is uprightly provided at the bottom of the processing chamber 22. A rectifying plate 40 for forming a gas flow of downward direction is provided on the upper peripheral portion of the cylindrical supporting column 38. A ring-shaped attachment member 44 made of, e.g., quartz is adhered to an upper inner peripheral portion of the supporting column 38 via a ring-shaped auxiliary ring 42 made of, e.g., aluminum.

Figure 3:
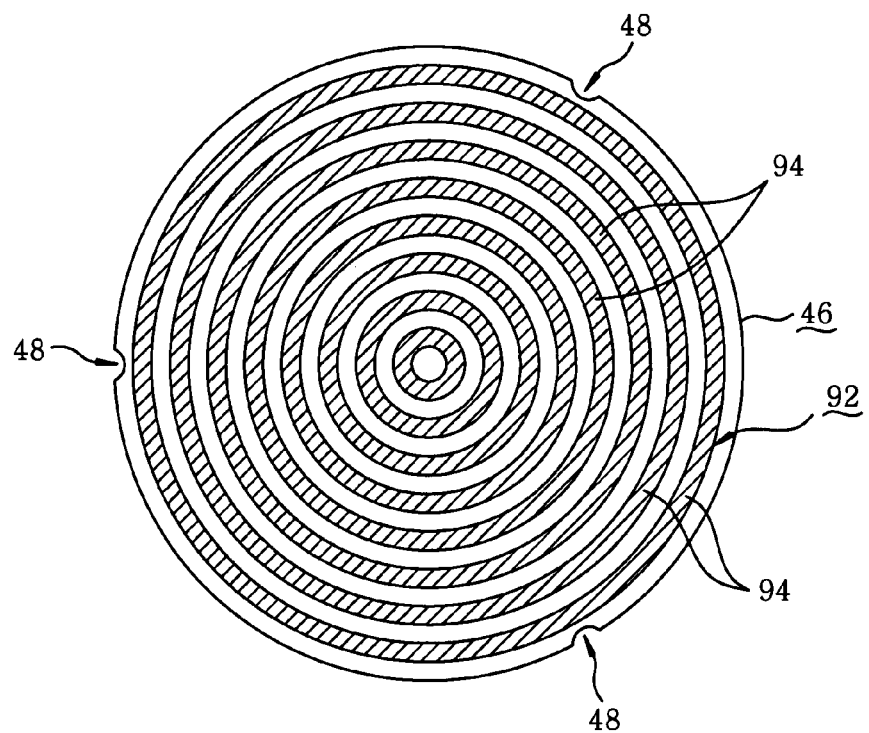
FIG. 3 is a plane view illustrating a mounting table of the film forming apparatus shown in FIG. 1.

Further, a mounting table 46 is supported by an inner peripheral portion of the attachment member 44. The mounting table 46 is formed in a thin circular plate shape having a thickness of about 3.5 mm made of ceramic, e.g., aluminum nitride. The upper surface of the mounting table 46 serves as a mounting surface for mounting thereon a semiconductor wafer W, i.e., a target object which has substantially the same diameter as the upper surface of the mounting table 46. A backside of the mounting table 46 is colored with black in order to enhance absorption of an irradiated light. As illustrated in FIG. 3, three pin holes 48 through which respective lift pins are moved are formed at regular interval in a circumferential direction on the outer edge of the mounting table 46. Here, each of the pin holes 48 is formed as a semicircular notch opened outwardly.

Further, a ring-shaped end portion 50 for supporting the mounting table 46 is formed at the inner periphery of the attachment member 44. Three notches (not shown) through which the respective lift pins are moved in the same manner are formed at the positions corresponding to those of the pin holes 48 of the mounting table 46. Furthermore, three rod holes 52 through which rod members or the like for supporting a clamp ring, which will be described later, are formed at positions corresponding to the notches on the attachment members 44.

Moreover, the three lift pins 54 are uprightly provided at an outer position under the mounting table 46. The lift pins 54 move through the pin holes 48 of the mounting table 46 and the notches of the attachment members 44 to support the edge of the wafer W; and the wafer can be moved up and down by moving them up and down.

Figure 2:
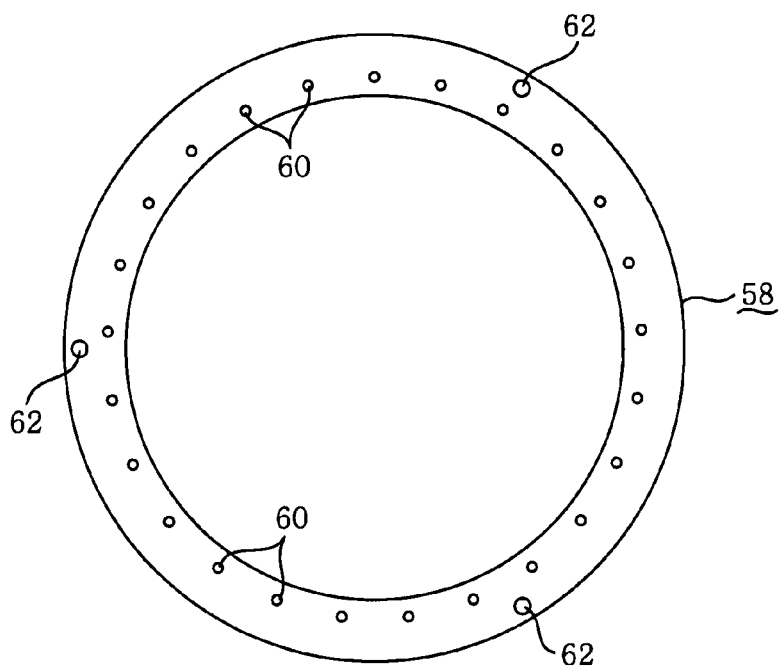
FIG. 2 depicts a bottom view of a clamp ring of the film forming apparatus shown in FIG. 1.

Moreover, a clamp device 56 for holding the wafer W in place to prevent mislocation of the wafer W is provided in the vicinity of the outer edge of the mounting table 46. The clamp device 56 includes a thin clamp ring 58 having a lager diameter than that of the wafer W. The clamp ring 58 is formed of a material that may hardly contaminate the wafer W and is of good heat-resistance and of low expansion-contraction amount, e.g., a ceramic such as aluminum nitride or the like. As shown in FIG. 2, at the inner side of the bottom surface of the clamp ring 58, minute protrusions 60 are circumferentially provided at regular intervals. The clamp devices 56 clamps/releases the wafer W against the mounting table 46 by moving the clamp ring 58 up and down to make the protrusions 60 of the clamp ring 58 contact with or separated from the peripheral portion of the wafer W surface.

The clamp ring 58 is connected to three shaft members 62 arranged at regular intervals in a circumferential direction. The lower portions of the shaft members 62 are respectively supported by elastic members (not shown) accommodated in tubes 64 made of, e.g., quartz so that they can elastically move up and down. An arm member 66 made of, e.g., quartz and extended outwardly in a horizontal direction with respect to the clamp ring 58 is connected to an outside of a lower portion of each tube 64. Each of the arm members 66 is connected to a ring-shaped supporting plate 68 made of, e.g., ceramic such as an aluminum oxide or the like. One side of the supporting plate 68 is supported by a vertical elevation rod 70 connected to the bottom surface thereof. A lower end of the elevation rod 70 is connected to an actuator (not shown) through an expansible/contractible bellows 72 in order to keep the inside of the processing chamber 22 in airtight state.

Further, in a bottom portion of the processing chamber provided at a location just below the mounting table 46, a transmission window 74 made of a heat ray transmission material such as quartz or the like is airtightly provided via a seal member 76 such as an O-ring or the like. A box-shaped lamp vessel 78 is provided under the transmission window 74. In the lamp vessel 78, a plurality of heating lamps 80 as heaters are attached to a rotating table 82 also serving as a reflection mirror. Irradiation light (heat ray) released from the heating lamps 80 transmits through the transmission window 74 to be irradiated to the bottom surface of the mounting table 46, thereby heating it.

Moreover, on the bottom of the processing chamber 22, a cylindrical reflection member 84 formed of, e.g., aluminum is provided inside the supporting column 38. The reflection member 84 has a diameter slightly larger than that of the semiconductor wafer W and the inner surface thereof is mirror-finished. The reflection member 84 is configured to reflect the irradiation light incident thereon obliquely from below and released from the heating lamps 80 toward the backside of the mounting table 46. The top end of the reflection member 84 is extended to a location just below the attachment member 44. Three accommodating spaces 86 for accommodating the tubes 64 for the elastic members are defined in the upper portion of the reflection member 84, the accommodating spaces 86 being separated from each other in a circumferential direction.

Provided under the reflection member 84 is a backside gas supply system 88 for introducing an inert gas, e.g., Ar gas, as a backside gas into a space below the mounting table 46. The backside gas supply system 88 has a gas introducing path 90 communicating with the space below the mounting table 46 and a gas source (not shown), and can supply the Ar gas through the gas introducing path 90 at a controlled flow rate.

Figure 4:
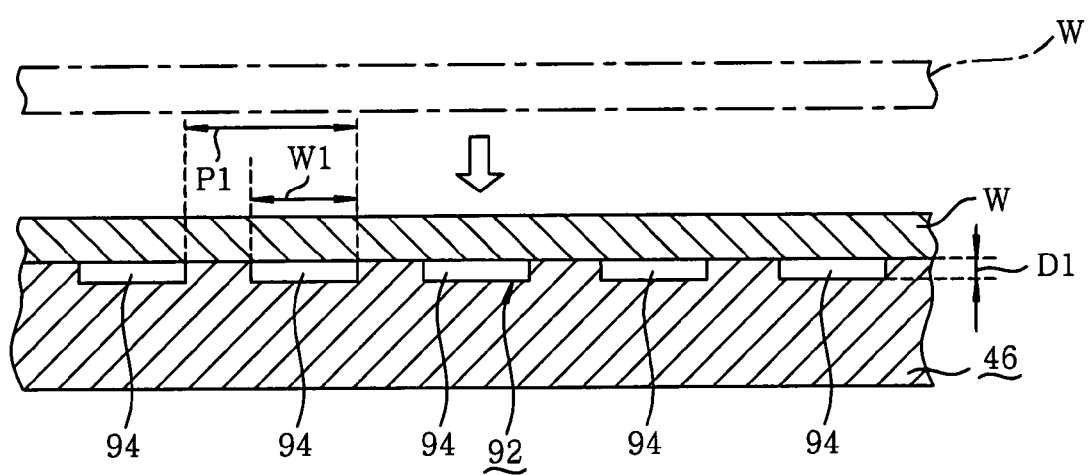
FIG. 4 is a partially enlarged cross sectional view of the mounting table shown in FIG. 3 and a target object mounted thereon.

An adsorption structure 92 for adsorbing the wafer W temporally by a pressure difference is formed in the mounting surface, i.e., the top surface of the mounting table 46. As shown in FIGS. 3 and 4, the adsorption structure 92 includes a plurality of ring-shaped recesses 94 arranged concentrically with each other (in FIG. 3, each recess is marked with hatching lines). In FIG. 4, each recess 94 has a rectangular-shaped cross section with, e.g., a width (W1) of about 3 mm and a depth (D1) of about 0.3 mm. Each recess 94 can form a substantially sealed space of a rectangular shaped cross section together with the backside of the wafer W. The recesses 94 are separated from each other by a substantially equal distance on the area of the mounting surface that is covered by the wafer W. The distance P1 between the recesses 94 is, e.g., about 5 mm. The distance may be properly determined based on an adsorptive force and an adsorption time, which depend on a pressure difference between before and after process and an airtightness of the space formed between the backside of the wafer and the mounting surface.

Moreover, the film forming apparatus 20 includes a controller 100 having, e.g., a micro computer or the like which contains a computer program for controlling the gas exhaust system, the gas supply system, the heating lamps 80, the clamp device 56 and the like to execute a film forming method. The controller 100 reads the program from, e.g., a storage medium (semiconductor memory, hard disk drive, DVD or the like) that stores the program.

The film forming method will now be described with reference to FIG. 5.

Here, there will be described a case where, after a seed film made of a crystal nucleus of tungsten is formed as a first thin film in a first thin film forming process, a main film made of metal tungsten is formed as a second thin film by employing a CVD method at a higher film forming rate in a second thin film forming process. A feature of the present invention is to form the seed film as the first thin film over a wider area of the peripheral portion of the wafer surface by performing the first thin film forming process that takes relatively a short period of time while the wafer is adsorbed onto the mounting surface with the help of the adsorption structure 92.

Figure 5A:
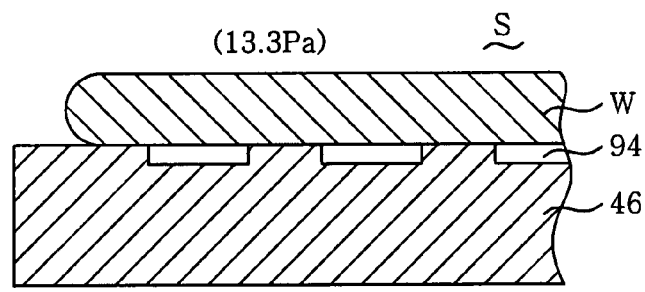
FIGS. 5A to 5C are partially enlarged cross sectional views for representing a film forming method in accordance with the present invention sequentially.

First, the wafer W is loaded into the processing chamber 22 via the opened gate valve G to be put on the lift pins 54 that are lifted up. Next, the wafer W is mounted on the mounting surface of the mounting table 46 by lowering the lift pins 54. The wafer W has an underlying film such as a TiN film formed as a barrier layer in advance in a previous process. FIG. 5A shows the state at this time and the peripheral portion of the wafer W is not yet clamped by the clamp ring 58.

After the gate valve G is closed, a depressurizing process is performed by using the gas exhaust system, the inside of the processing chamber 22 is depressurized to an initial pressure lower than an atmospheric pressure. The initial pressure is lower than the process pressure of the first thin film forming process, e.g., 1000 Pa or less and preferably about 13.3 Pa.

At this time, since the wafer W on the mounting table 46 is not clamped by the clamp ring 58, the airtightness between the mounting surface and the backside of the wafer W is poor, and thus atmosphere of each recess 94 of adsorption structure 92 easily leaks into the processing chamber 22. As a consequence, the pressure in each recess 94 becomes equal to that in the processing chamber 22. Though a pressure decreasing time depends on the pressure in the processing chamber 22 right before the depressurizing process, it is approximately, e.g., about 4 to 10 seconds.

Moreover, the wafer W may be kept lifted up a little bit higher than the mounting surface while the pressure being decreased and then be lowered after the pressure decreasing is completed, thereby reaching the state shown in FIG. 5A.

Figure 5B:
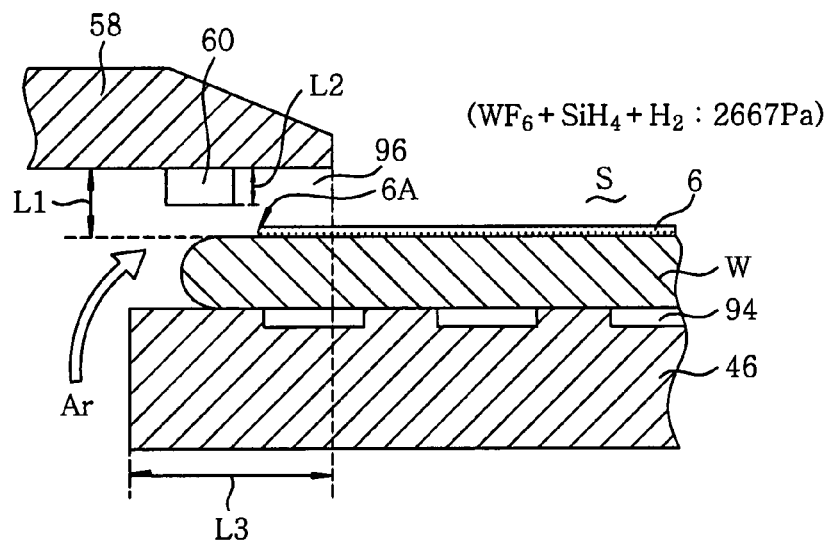

After the pressure decreasing process is completed in this way, the first thin film forming process is performed next. In the first film forming process, the clamp ring 58 of the clamp device 56 is lowered and stopped just before it makes a contact with the peripheral portion of the wafer W so that it remains barely separated therefrom as shown in FIG. 5B. A distance L1 between the surface of the wafer W and a bottom surface of the clamp ring 58 is about 4 mm. Further, a height L2 of the protrusion 60 of the clamp ring 58 is about 20 to 50 μm and an overlapping width in horizontal direction L3 between the clamp ring 58 and the peripheral portion of the wafer W is about 2 to 4 mm.

First, the inside of the processing chamber 22 is depressurized to a process pressure that is higher than the initial pressure but lower than the atmospheric pressure. At the same time, heat energy in the form of the irradiation light is radiated while rotating the heating lamps 80 turned on. The radiated irradiation light transmits through the transmission window 74 to be irradiated to the backside of the mounting table 46, thereby heating it. The mounting table 46 is very thin, so that it is rapidly heated, which, in turn, can rapidly heat the wafer W mounted thereon to a specific temperature.

When a temperature of the wafer reaches to a process temperature, processing gases including, e.g., as the film forming gas, $WF_6$ gas, $SiH_4$ gas and $H_2$ gas are supplied simultaneously through the shower head 24 into the processing space S of the processing chamber 22. The CVD processing for forming the seed film 6 made of a crystal nucleus of tungsten as the first thin film is performed. During the film forming process, e.g., Ar gas is supplied as the backside gas through the gas introducing path 90 of the backside gas supply system 88 into the space below the mounting table 46, while its flow rate being controlled. Accordingly, it is prevented that an unnecessary film is deposited on the backside of the mounting table 46 or on the top surface of the transmission window 74 due to the infiltration of the processing gas into the space.

The process conditions in this case are as follow: the process pressure is in a range from about 100 to 12000 Pa, the process temperature is in a range from about 300 to 500° C., and the process time is in a range from about 5 to 60 seconds.

Figure 10A:
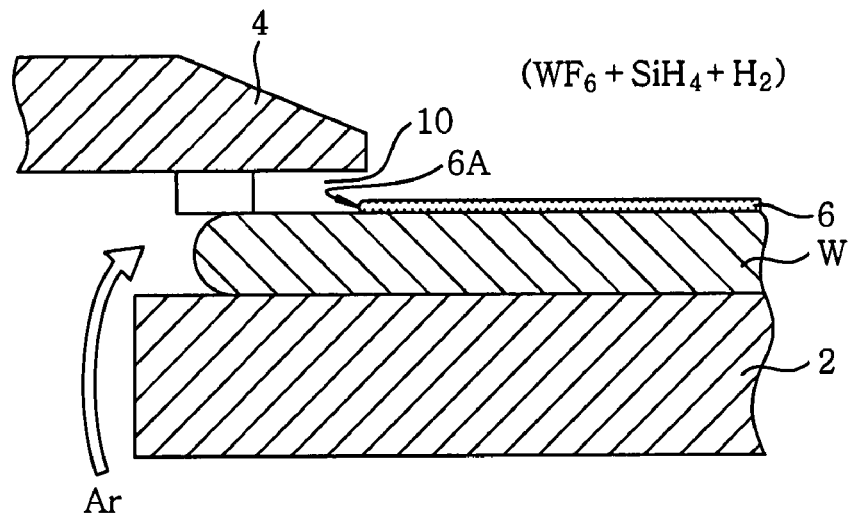
FIGS. 10A to 10B are partially enlarged cross sectional views for representing a conventional film forming method sequentially.

Here, as described above, since the Ar gas is supplied into the space below the mounting table 46 as the backside gas, infiltration of the film forming gas into the space is substantially prevented. Meanwhile, the distance L1 between the bottom surface of the clamp ring 58 and the surface of the wafer W is set to be about 4 mm to form a relatively wide gap 96, so that the film forming gas infiltrates quite deeply into the inside of the gap 96. Accordingly, the outer edge 6A of the seed film 6 is widely formed to a location near the edge of the wafer W on the peripheral portion thereof. In other words, the outer edge 6A of the seed film 6 becomes extended outwardly much further in a radial direction of the wafer W than in the conventional case shown in FIG. 10A.

In the first thin film forming process, since the wafer W is adsorptively held by the recesses 94 of the adsorption structure on the mounting table 46, it will not be slid to its side on the mounting table 46.

That is, since the substantially sealed spaces formed between the backside of the wafer W and the recesses 94 is made to have a lower inner pressure than the process pressure of the processing space S, the wafer W is adsorptively held on the mounting surface by the pressure difference.

The inner atmosphere of the processing space S of comparatively higher pressure infiltrates from between the backside of the wafer W and the mounting surface into the recesses 94 little by little, and the pressure difference becomes lowered slowly, thereby deteriorating the adsorptive force. However, since the process time of the first thin film forming process is a short time of length about 30 seconds as described above, a strong enough adsorptive force (pressure difference) to hold the wafer can be maintained during that short time period.

After the first thin film forming process is completed in this way, the second thin film forming process begins to be performed.

Figure 5C:
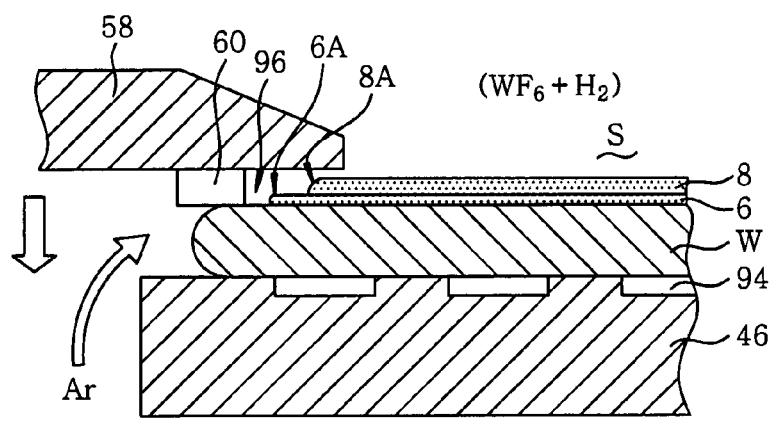

In the second thin film forming process, by making the clamp ring 58 of the clamp device 56 have a contact with the peripheral portion of the surface of the wafer W as described in FIG. 5C, the wafer W is pressed against the mounting table 46 to be kept in place. As a consequence, the wafer W is completely kept in place irrespective of the pressure in the recesses 94, thereby preventing it from sliding to its side. In this state, the processing gas containing the film forming gas, $WF_6$ gas and $H_2$ gas, are supplied and the second thin film of tungsten metal film is formed, by employing the CVD film forming process, as the main film 8 at a higher film forming rate starting from the surface of the seed film 6.

At this time, the Ar gas is also supplied as the backside gas into the space below the mounting table 46. The process conditions are as follows: the process pressure is in a range from about 1000 to 12000 Pa, e.g., 10666 Pa (80 Torr), the process temperature is in a range from, e.g., about 300 to 500° C., and the process time depending on a film thickness to be formed is, e.g., about 60 sec.

In the second film forming process shown in FIG. 5C, the distance between the bottom surface of the clamp ring 58 and the surface of the wafer W, i.e., the height of the gap 96 is much lower than that of the first film forming process shown in FIG. 5B. Therefore, the film forming gas in the processing space S can hardly infiltrate into the inside of the gap 96 with an additional help of an effect of the backside gas. Accordingly, the outer edge 8A of the main film 8 is formed without being extended too much outwardly in a radial direction of the wafer W. In other words, the outer edge 8A of the main film 8 is terminated at a position located inwardly in a radial direction than the outer edge 6A of the seed film 6.

Figure 10B:
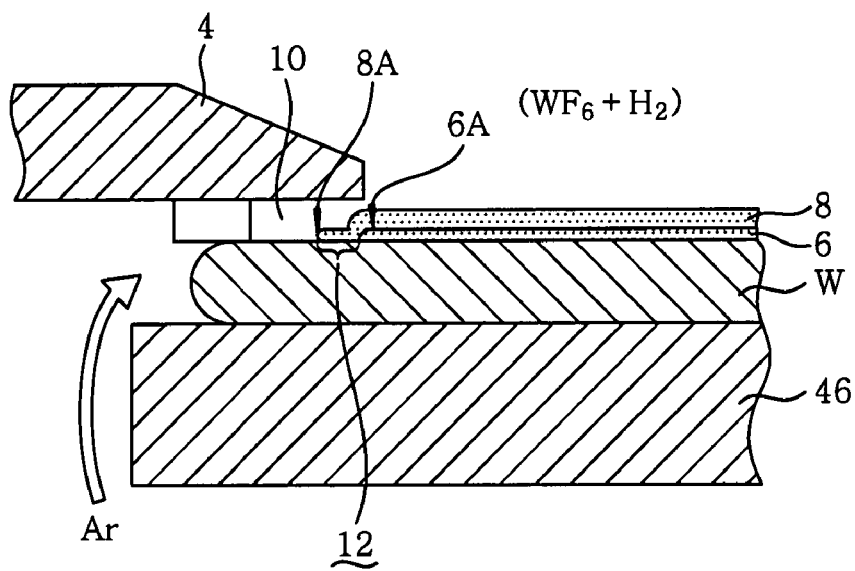

As a consequence, unlike the conventional case shown in FIG. 10B, an exposed surface, where the seed film 6 is not formed, of the peripheral portion of the wafer can be prevented from being attacked and damaged by fluorine of $WF_6$ gas. Also, the TiN barrier layer of the exposed surface can be prevented from reacting with the fluorine.

After the second film forming process is completed, temperature of the wafer is decreased by stopping the supply of each gas. However, since the recesses 94 are substantially uniformly distributed on the mounting surface, the temperature of the wafer W can be decreased while maintaining the in-surface uniformity thereof.

In the first film forming process of this embodiment, the seed film 6 is formed by employing the CVD film forming method while supplying the $WF_6$, $SiH_4$ and $H_2$ gases simultaneously, but the present invention is not limited thereto. For example, by supplying the $WF_6$ and $SiH_4$ gases alternately, an extremely thin seed film with a thickness of atomic level or molecular level may be sequentially deposited. Such a film forming method is referred to as SFD (Sequential Flow Deposition). In case of the SFD film forming, it takes about 2 to 10 seconds, e.g., six seconds to complete a cycle and a series of cycles including from several cycles to less than twenty cycles may be performed successively. Accordingly, since a total film forming process can be completed in a short time of about sixty seconds, it can be performed while the wafer W being adsorptively held by the adsorption structure 92.

Figure 6:
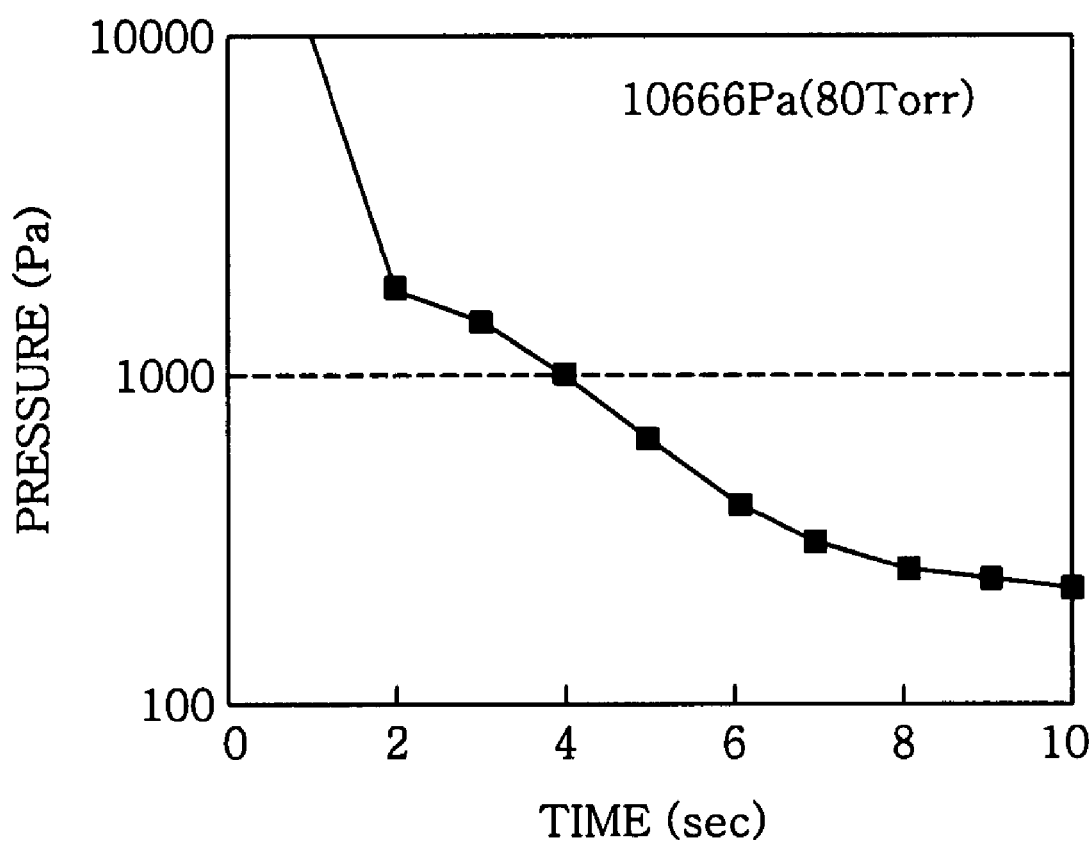
FIG. 6 is a graph describing pressure variations while the inside of a processing chamber is vacuum-exhausted in the film forming apparatus shown in FIG. 1.

Here, it was checked how much time was required to decrease the inner pressure of the processing chamber 22 from 10666 Pa (80 Torr) to 1000 Pa. FIG. 6 represents a pressure change during that time. As is clearly shown in FIG. 6, it is confirmed that it takes about 4 seconds to lower the inner pressure of the processing chamber 22 from 10666 Pa to 1000 Pa or less. Accordingly, it can be confirmed that the time required for the pressure decreasing process performed just before the first film forming process can be very short.

Since it was actually tested whether or not the wafer slid while performing the first film forming process by employing the SFD, the test result will be described. In that test, after the inner pressure of the processing chamber 22 was set to be 10666 Pa, the pressure decreasing process was then performed and the first film forming process was performed for fifty seconds. Thereafter, whether or not the wafer slid in the first film forming process was investigated. From the result of the test, it was found out that the wafer had slid when a setting time of the pressure decreasing process was about 5 seconds, but that the wafer W did not slide when the setting time was six seconds or greater.

Now, a modification of the adsorption structure 92 shown in FIG. 8 will be described. The adsorption structure 92 in FIG. 8 has a plurality of communication recesses 98 making the ring-shaped recesses 94 shown in FIG. 3 communicate with each other. Each communication recess 98 is arranged in a diameter direction of the mounting table 46. As a consequence, the ring-shaped recesses 94 communicate with each other, so that there becomes no pressure difference between ring-shaped recesses 94, which can enhance an adsorption uniformity in the wafer W during the first film forming process and can also further enhance an in-surface uniformity of temperature while lowering the temperature of the wafer.

Figure 7A:
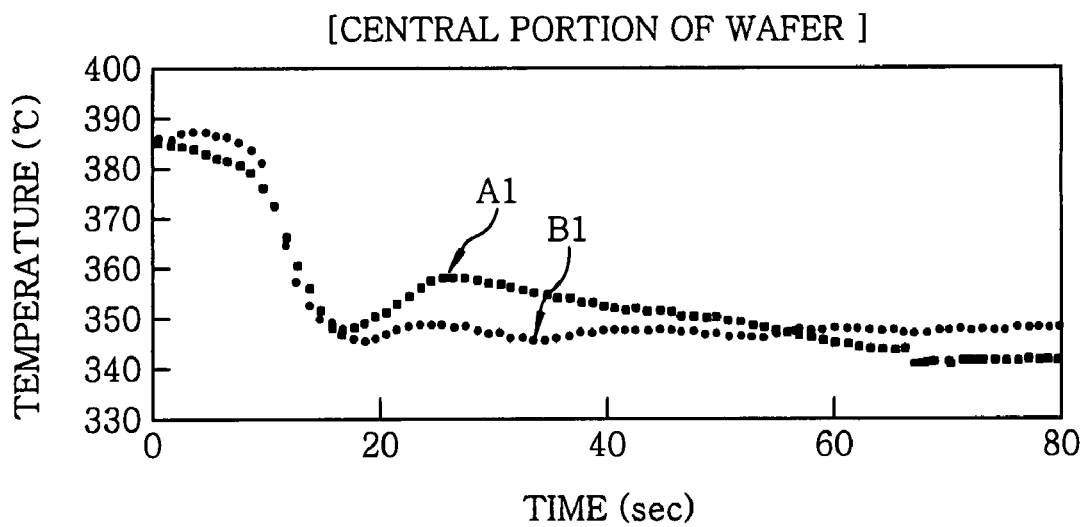
FIGS. 7A and 7B are graphs showing temperature changes in a central portion and a peripheral portion of a semiconductor wafer while the temperature of the wafer is decreased in the film forming apparatus shown in FIG. 1.
Figure 7B:
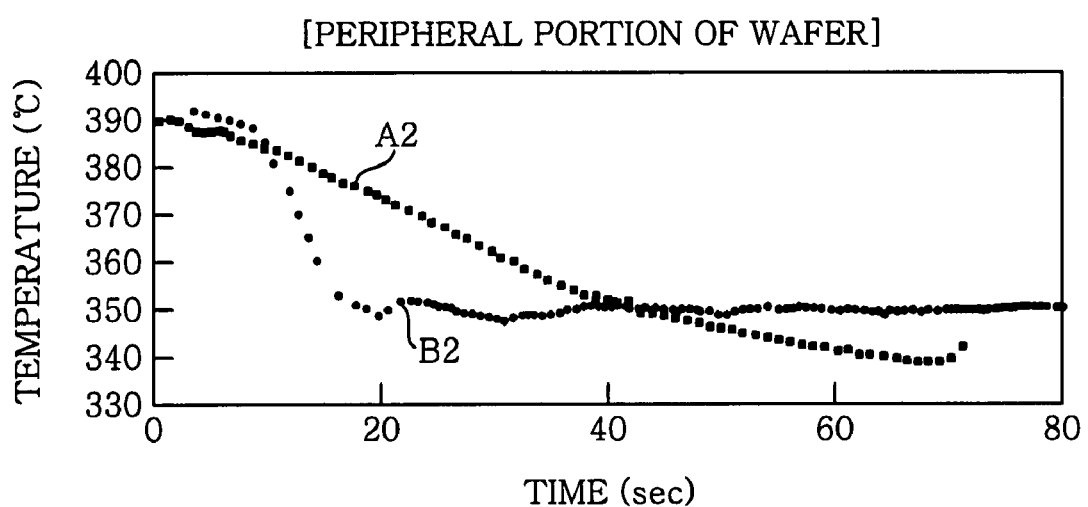

Next, after the second film forming process is completed, results of simulating temporal variations (FIGS. 7A and 7B) in temperature distribution while decreasing the temperature of the wafer in order to unload the wafer will be described. FIG. 7A shows the temporal temperature variations in a central portion of the wafer and FIG. 7B illustrates the temporal temperature variations in a peripheral portion of the wafer.

Figure 8:
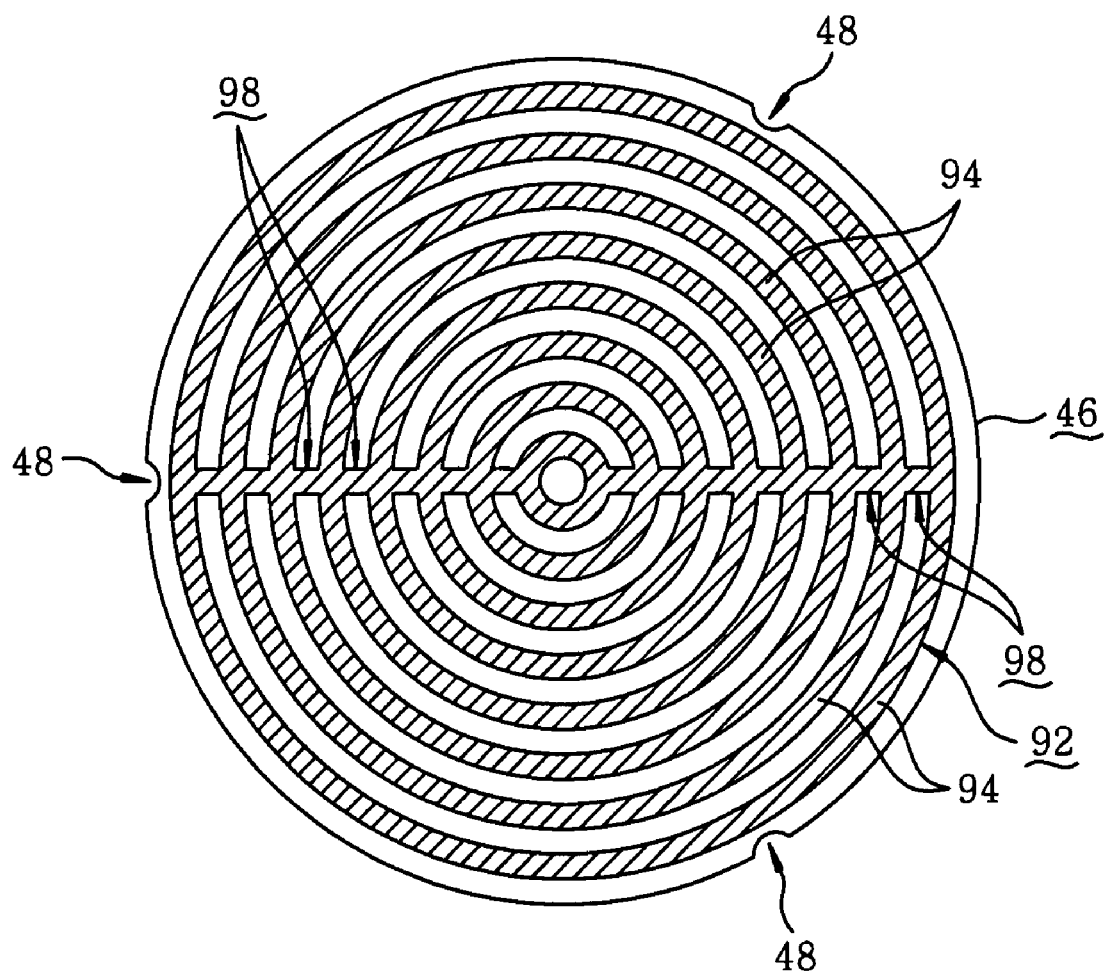
FIG. 8 is a diagram depicting a modification of the mounting table shown in FIG. 3.

In the Figures, curves A1 and A2 describe the temperature of the wafer processed on the mounting table shown in FIG. 3;

and curves B1, B2 represent the temperature of the wafer processed on the mounting table shown in FIG. 8.

In case of the mounting table shown in FIG. 3, the temperature is rapidly decreased at the beginning only in the curve A1, but it has been found that the temperature distribution generated in the surface of the wafer is maintained uniform to a certain degree on the whole. Moreover, in case of the mounting table shown in FIG. 8, it has been found that the curves B1 and B2 represent a similar trends in which the temperature is rapidly decreased at the beginning and that the temperature distribution generated in the surface of the wafer is maintained in a substantially uniform state, which are better than those of the curves A1 and A2.

Figure 9A:
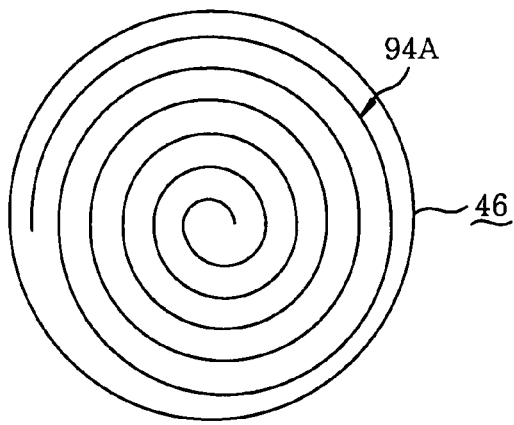
FIGS. 9A to 9C are diagrams illustrating three modifications of adsorption structures formed on the mounting surface of the mounting table shown in FIG. 3.
Figure 9B:
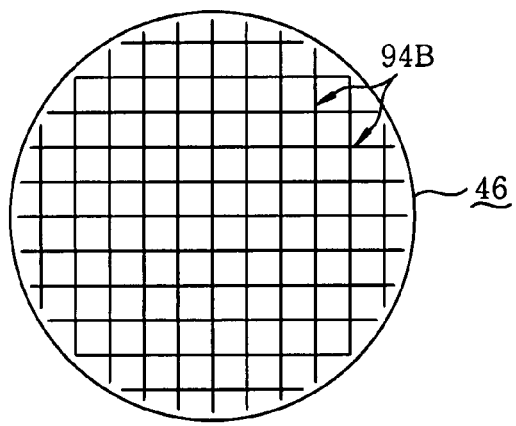
Figure 9C:
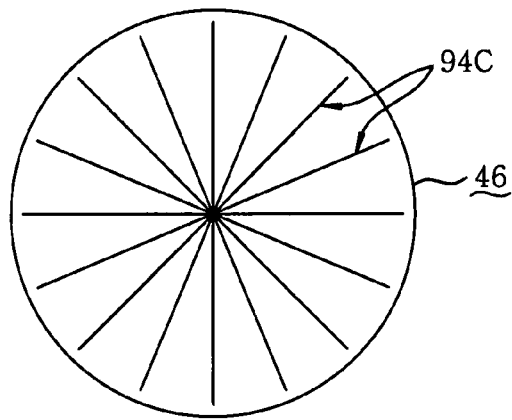

The adsorption structure 92 of this embodiment is not limited to those formed by the ring-shaped recesses 94 arranged concentrically as shown in FIGS. 3 and 8. For example, it may have a continuous spiral recess 94A shown FIG. 9A, or a plurality of linear recesses 94B arranged in a grid pattern as shown in FIG. 9B or a plurality of linear recesses 94C radially arranged as shown in FIG. 9C.

Further, in this embodiment, monosilane ($SiH_4$) is used as a film forming gas for the first thin film, but disilane, dichlorsilane or the like may be used instead of that. Furthermore, although there has been described that the seed film made of a crystal nucleus of tungsten is formed as the first thin film and the main film made of metal tungsten is formed as the second thin film, the present invention is not limited thereto. That is, the present invention may be applied in a case where the first and the second thin film are sequentially formed on a surface of a flat target object.

Furthermore, in this embodiment, the semiconductor wafer has been exemplified as a target object, but the present invention is not limited thereto. For example, the present invention may be applied to a flat target object such as an LCD substrate, a glass substrate or the like.

What is claimed is:

1. A film forming apparatus comprising:
    a processing chamber;
    a gas exhaust system for exhausting an inner atmosphere of the processing chamber;
    a mounting table having a mounting surface for mounting thereon a flat target object, the mounting table being provided in the processing chamber;
    a gas supply system for supplying a processing gas containing a film forming gas into the processing chamber,
    a heater for heating the target object on the mounting table;
    a clamp device for pressing and releasing the target object with respect to the mounting table by contacting with and separating from a peripheral portion of a surface of the target object;
    an adsorption structure formed on the mounting surface of the mounting table for adsorbing the target object temporarily by means of a pressure difference caused by substantially sealed spaces defined between a backside of the target object and the mounting surface of the mounting table; and
    a controller which controls the gas exhaust system, the gas supply system, the heater, and the clamp device to perform the steps of:
        (a) adjusting the pressure in the processing chamber to an initial pressure;
        (b) forming a first thin film on the surface of the target object, which includes the sub-steps of (b1) adsorbing the target object on the mounting table with the help of the adsorption structure by adjusting the inner pressure of the processing chamber to a level higher than the initial pressure while the clamp device is separated from the target object; and (b2) forming the first thin film by supplying a first processing gas into the processing chamber while heating the target object adsorbed on the mounting table; and
        (c) forming a second thin film on the first thin film, which includes the sub-steps of (c1) pressing the target object against the mounting table by making the clamp device contact with the target object; and (c2) forming the second thin film by supplying a second processing gas into the processing chamber while heating the target object pressed against the mounting table.

2. The film forming apparatus of claim 1, wherein the adsorption structure has recesses formed in the mounting surface of the mounting table.

3. The film forming apparatus of claim 2, wherein the recesses are distributed substantially uniformly in an area on the mounting surface which is covered by the target object.

4. The film forming apparatus of claim 2, wherein a plurality of ring-shaped recesses are concentrically arranged on the mounting surface of the mounting table.

5. The film forming apparatus of claim 4, wherein communication recesses for allowing the ring-shaped recesses to communicate with each other are further formed in the mounting surface of the mounting table.

6. The film forming apparatus of claim 2, wherein the recesses are spirally formed in the mounting surface of the mounting table.

7. The film forming apparatus of claim 2, wherein a plurality of linear recesses are arranged in a grid pattern on the mounting surface of the mounting table.

8. The film forming apparatus of claim 2, wherein a plurality of linear recesses are radially arranged on the mounting surface of the mounting table.

9. A film forming method for forming a first and a second thin film sequentially on a surface of a target object by using a film forming apparatus including:
    a processing chamber;
    a mounting table having a mounting surface for mounting thereon the flat target object , the mounting table being provided in the processing chamber;
    a clamp device for pressing and releasing the target object with respect to the mounting table by contacting with and separating from a peripheral portion of a surface of the target object; and
    an adsorption structure formed on the mounting surface of the mounting table for adsorbing the target object temporarily by means of a pressure difference caused by substantially sealed spaces defined between a backside of the target object and the mounting surface of the mounting table;
    the film forming method comprising the steps of:
        (a) adjusting the inner pressure in the processing chamber to an initial pressure;
        (b) forming the first thin film on a surface of the target object, which includes the sub-steps of (b1) adsorbing the target object on the mounting table with the help of the adsorption structure by adjusting the pressure in the processing chamber to a level higher than the initial pressure while the clamp device is separated from the target object; and (b2) forming the first thin film by supplying a first processing gas into the processing chamber while heating the target object adsorbed on the mounting table;
        (c) forming the second thin film on the first thin film, which includes the sub-steps of (c1) pressing the target object against the mounting table by making the clamp device contact with the target object; and (c2) forming the second film by supplying a second processing gas into the processing chamber while heating the target object pressed against the mounting table.

10. The film forming method of claim 9, wherein the first thin film is a seed film and the second thin film is a main film formed on the seed film.

11. The film forming method of claim 10, wherein the first thin film is the seed film made of a crystal nucleus of tungsten and the second thin film is the main film made of metal tungsten.

12. A storage medium storing a program for controlling a gas exhaust system, a gas supply system, a heater and a clamp device to perform a film forming process for forming a first and a second thin film sequentially on a surface of a target object by using a film forming apparatus including:

a processing chamber;

the gas exhaust system for exhausting an inner atmosphere of the processing chamber;

a mounting table having a mounting surface for mounting thereon the flat target object, the mounting table being provided in the processing chamber;

the gas supply system for supplying a processing gas containing a film forming gas into the processing chamber, the heater for heating the target object on the mounting table;

the clamp device for pressing and releasing the target object with respect to the mounting table by contacting to and separating from a peripheral portion of a surface of the target object; and an adsorption structure formed on the mounting surface of the mounting table for adsorbing the target object temporarily by means of a pressure difference caused by substantially sealed spaces defined between a backside of the target object and the mounting surface of the mounting table; and wherein the film forming process comprises the steps of:

(a) adjusting the pressure in the processing chamber to an initial pressure;

(b) forming the first thin film on the surface of the target object, which includes the sub-steps of (b1) adsorbing the target object on the mounting table with the help of the adsorption structure while separating the clamp device from the target object by adjusting the pressure in the processing chamber to a level higher than the initial pressure; and (b2) forming the first thin film by supplying a first processing gas into the processing chamber while heating the target object adsorbed on the mounting table; and (c) forming the second thin film on the first thin film, which includes the sub-steps of (c1) pressing the target object against the mounting table by making the clamp device contact with to the target object; and (c2) forming the second thin film by supplying a second processing gas into the processing chamber while heating the target object pressed against the mounting table.

13. The film forming apparatus of claim 1, wherein in the sub-step (b1), the clamp device is lifted not to contact with the target object, so that the target object is mounted in position on the mounting table by the adsorption structure without the help of the clamp device, and in the sub-step (c1), the target object is mounted in position on the mounting table by the clamp device and the adsorption structure.

14. The film forming apparatus of claim 1, wherein the gap between the target object and the clamp device in the sub-step (b1) is greater than that in the sub-step (c1), so that the second thin film is not formed directly on the target object.

15. The film forming apparatus of claim 13, wherein the gap between the target object and the clamp device in the sub-step (b1) is greater than that in the sub-step (c1), so that the second thin film is not formed directly on the target object.

16. The film forming method of claim 9, wherein in the sub-step (b1), the clamp device is lifted not to contact with the target object, so that the target object is mounted in position on the mounting table by the adsorption structure without the help of the clamp device, and in the sub-step (c1), the target object is mounted in position on the mounting table by the clamp device and the adsorption structure.

17. The film forming method of claim 9, wherein the gap between the target object and the clamp device in the sub-step (b1) is greater than that in the sub-step (c1), so that the second thin film is not formed directly on the target object.

18. The film forming method of claim 16, wherein the gap between the target object and the clamp device in the sub-step (b1) is greater than that in the sub-step (c1), so that the second thin film is not formed directly on the target object.

19. A storage medium storing a program of claim 12, wherein in the sub-step (b1), the clamp device is lifted not to contact with the target object, so that the target object is mounted in position on the mounting table by the adsorption structure without the help of the clamp device, and in the sub-step (c1), the target object is mounted in position on the mounting table by the clamp device and the adsorption structure.

* * * * *